United States Patent [19]

Faith, Jr.

[11] Patent Number: 4,605,479

[45] Date of Patent: Aug. 12, 1986

[54] IN-SITU CLEANED OHMIC CONTACTS

[75] Inventor: Thomas J. Faith, Jr., Lawrenceville, N.J.

[73] Assignee: RCA Corporation, Princeton, N.J.

[21] Appl. No.: 748,350

[22] Filed: Jun. 24, 1985

[51] Int. Cl.$^4$ .............................................. C23C 15/00
[52] U.S. Cl. .............................. 204/192 D; 156/646;
204/192 EC; 204/192 R; 427/69
[58] Field of Search ................. 156/646; 204/192 EC,
204/192 E, 192 R, 192 D; 427/69

[56] References Cited

U.S. PATENT DOCUMENTS 1,980,021  11/1934  Wetherbee ........................ 156/646
2,324,087  7/1943  Jelley ................................ 156/646

FOREIGN PATENT DOCUMENTS 53-97374  8/1978  Japan ................................ 156/646

OTHER PUBLICATIONS

Hoefler, Microelectronics News, Sep. 29, 1984.
Holmes et al., Microelectronics and Reliability, vol. 5, pp. 337–341 1966.
Ibbotson et al., J. Appl. Phys., vol. 56, No. 10, pp. 2939–2942, 1984 (Ibbotson et al. I).
Ibbotson et al., Appl. Phys. Lett. vol. 44, No. 12, pp. 1129–1131, 1984, (Ibbotson et al. II).

Primary Examiner—Arthur P. Demers
Attorney, Agent, or Firm—B. E. Morris; R. H. Swope

[57] ABSTRACT

A process of forming improved ohmic contacts is disclosed. Substrates having contact openings formed in a dielectric layer thereon are cleaned under vacuum with HF/H$_2$O vapor wherein the temperature of the vapor is at least about 5° C. lower than that of the substrate. The cleaned substrates are then metallized in-situ in a closed system, e.g. by magnetron sputtering, thus preventing air from contacting the substrate. The cleaning and metallization each require about one minute, thus making the process suitable for efficient, large-scale operation.

10 Claims, 1 Drawing Figure

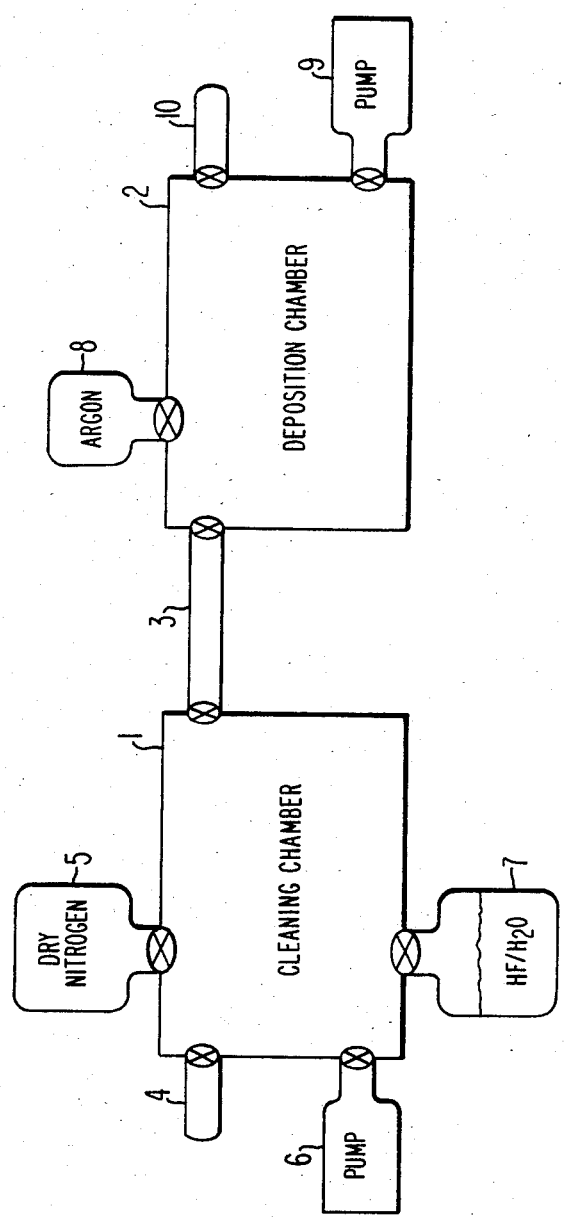

IN-SITU CLEANED OHMIC CONTACTS

This invention relates to a process of forming consistently excellent ohmic contacts between a layer of metallization and a silicon substrate. This process is exceptionally useful in the production of very-large-scale integrated circuits (VLSI).

BACKGROUND OF THE INVENTION

For successful operation, integrated circuits require consistent, low-resistance contacts, for example, between a silicon substrate and aluminum metallization, i.e. aluminum or an alloy thereof. The formation of such contacts becomes increasingly difficult as the dimensions of such devices shrink to approach one micrometer and there is substantially less area available on which to provide the contact.

A major problem encountered in attempting to establish a contamination free ohmic contact is the native oxide which forms on silicon immediately upon exposure to air. The layer of native oxide, which is generally only about 30 to 50 angstroms thick, is an insulator and, therefore, is detrimental to the efficacy of the contact. Conventionally, this oxide layer is removed by dipping the substrate, e.g. a silicon wafer, into a dilute, aqueous solution of hydrogen fluoride, HF. The substrate is thereafter withdrawn, rinsed and dried thoroughly, and transferred as rapidly as possible to a vacuum deposition system for the deposition of a layer of metallization thereon.

While the conventional method of cleaning substrates, e.g. silicon substrates, is satisfactory for openings no smaller than about three micrometers, it loses effectiveness as contact openings decrease in size. Although it is generally known in the electronics industry that contact openings become more difficult to clean as their dimensions shrink, the explanation therefor is not known with certainty. It is postulated, for example, that the native oxide grows from the sides of a contact opening cut into a layer of insulating oxide and that, the closer the sides, the more rapid the growth of native oxide.

Regardless of the mechanism responsible, the difficulty of cleaning contact cuts approaching one micrometer remains a significant problem. One attempt to solve this problem has been in-situ cleaning of contact cuts utilizing plasma discharge. Although this method can avoid contact of the substrate with air after cleaning, it also provides a source of contamination of the contact. Since such plasma cleaning includes physical sputtering, material from adjacent surfaces of the substrate, vapor phase impurities from the system, and wall and fixture materials within the system are simultaneously deposited in the contact cut as it is being cleaned. Thus, the results of these cleaning methods are often no better than the conventional HF dip.

In accordance with this invention, a process of forming ohmic contacts has been found which does not suffer from the disadvantages of previous methods.

SUMMARY OF THE INVENTION

Improved ohmic contacts between, e.g. a layer of aluminum metallization and a silicon substrate, are formed by cleaning the substrate to be contacted with hydrogen fluoride vapor in a vacuum chamber under conditions such that the substrate can be coated with the metallization in-situ without exposure to air.

BRIEF DESCRIPTION OF THE DRAWING

The FIGURE is a schematic illustration of a typical apparatus for carrying out the metallization process of this invention.

DETAILED DESCRIPTION OF THE INVENTION

The process of this invention will be described primarily with reference to forming a contact between aluminum metallization and a silicon substrate. The subject method, however, is equally applicable to other substrates which rapidly form an undesirable oxide or other compound upon exposure to air, which undesirable compounds are removable by etching in HF vapor. An example of such a substrate is one having a top layer of titanium metallization.

When the substrate to be metallized is silicon, it may be in any conventional form, preferably single crystal silicon. A silicon wafer typically contains buried within or on the surface various active or passive devices, such as transistors, diodes, resistors and the like. Another typical substrate useful in device manufacture which can be metallized by the subject method is a silicon-on-sapphire structure, i.e. a sapphire substrate having islands of epitaxial silicon on a major surface.

The substrate, particularly single crystalline silicon, is typically covered with a dielectric layer of, e.g., silicon dioxide through which contact openings have been made to overlie devices in or on the substrate. It is these openings which are cleaned in-situ in accordance with this invention. The term "aluminum metallization" as used herein includes aluminum and alloys thereof with silicon, silicon and copper, or silicon and titanium. Such alloys suitably contain up to about 3, preferably about 1, percent by weight of silicon.

The subject process is likewise applicable to what is termed "barrier metallization". In such structures, the contact is formed between the silicon substrate and a thin, e.g., 30 to 150 nm layer of a barrier metal which is in turn coated with aluminum metallization. Examples of metals useful in forming such a barrier interface include titanium, platinum silicide, titanium/tungsten alloys and the like. The barrier layer is utilized to prevent silicon from dissolving into the aluminum metallization during alloying and, in some instances, to improve the quality of the contact with the silicon substrate.

Contact openings in an oxide layer such as described above are cleaned in-situ by hydrogen fluoride/water vapor in a completely closed system under partial vacuum. It is important to the efficient operation of the subject process that the temperature of the substrate be higher than that of the HF/H$_2$O vapor source. By maintaining the substrate at a higher temperature, the reaction products of the cleaning process, principally water and fluosilicic acid, H$_2$SiF$_6$, which rapidly vaporize from the surface of the contact cut, do not condense back as droplets which can extend the etch beyond the desired opening and contaminate the wafer.

An illustrative apparatus for the metallization of a substrate in accordance with this invention is shown in the FIGURE. In the FIGURE, the cleaning of substrates is carried out in a cleaning chamber 1 and metallization thereof is carried out in a deposition chamber 2 which is connected to the cleaning chamber 1 by a loading port 3. When a barrier layer is desired, the barrier metallization would be deposited in chamber 2 and the contact metallization would be deposited in a third chamber, not illustrated, equipped in the same manner as chamber 2 and connected thereto by a loading port similar to loading port 3. The cleaning chamber 1 is equipped with an entry port 4 for the loading of substrates, suitably by cassette, a reservoir of dry nitrogen 5, a suitable vacuum pump 6 and a reservoir for aqueous hydrogen fluoride 7. Although the reservoir 5 is illustrated with dry nitrogen, other inert gases such as argon could be utilized as well. The deposition chamber 2 is equipped with a reservoir of argon 8, a suitable vacuum pump 9 and an exit port 10. The cleaning chamber 1, the dry nitrogen reservoir 5 and the hydrogen fluoride reservoir 7 are also equipped with temperature control means, not shown. The deposition chamber 2 also has temperature control means which would be utilized with certain deposition processes.

In operation, a substrate, or a batch of substrates, is introduced into the cleaning chamber 1 through the entry port 4. The substrates are suitably silicon wafers having a layer of insulating dielectric material, e.g. silicon dioxide, on the surface thereof and contact openings in the dielectric layer. It is, of course, desirable to introduce the substrates into the deposition chamber 1 as soon as possible after the contact openings have been made to minimize contact with the air and the resulting growth of oxide in the contact openings.

The cleaning chamber 1 and the dry nitrogen reservoir 5 are maintained at a temperature of at least about 30° C., suitably from about 30° to 40° C., and preferably about 35° C. After introduction of the substrate, the dry nitrogen reservoir 5 is opened and the cleaning chamber 1 is evacuated to about 150 mtorr to remove the air introduced during substrate transfer through the entry port 4. Pumping is suitably continued for a further period of about 15 seconds to assure removal of any residual air and moisture. The nitrogen bleed rate is then raised to about 1-5 torr (equivalent pressure) and the valve to HF reservoir 7 is opened, thus introducing $HF/H_2O$ vapor into the cleaning chamber. The hydrogen fluoride/water mixture is suitably at least 25 percent by weight of HF and, preferably, is full strength commercial, unbuffered HF which is about 49 percent by weight of HF The percent of HF can be increased to 100 percent. However, it is preferred that the etchant contain some water vapor since it enhances the cleaning, i.e. the etching step. The 49/51 percent mixture is particularly suitable because the two components volatilize in that proportion. The reservoir is therefore conventiently replenished without concentration determination and adjustment. The reservoir 7 of $HF/H_2O$ is suitably maintained at a temperature between about 15° and 25° C., preferably about 25° C. It is necessary that the $HF/H_2O$ reservoir 7 be maintained at a temperature at least about 5° C. lower than the cleaning chamber to prevent condensation of the etching vapor 1.

The etch mixture of HF and water vapor will etch contaminating oxide, e.g. silicon dioxide, at about 200 angstroms per minute under controlled conditions of partial vacuum and the above temperature differential with the substrate. This rate, however, is desirable for the preferred etch time of from about 10 to 20 seconds, since the contaminating oxide in the contact openings is generally not more than about 50 angstroms in thickness. It is important to control the etch rate to prevent overetching into the dielectric layer around a contact opening and the exposed substrate.

After etching of the contact openings is completed, the valve to $HF/H_2O$ reservoir 7 is closed and the cleaning chamber 1 is purged of volatile reaction products by pumping out the contents thereof with a backfill of preheated, dry nitrogen, suitably to a pressure of about 10 torr. The purging procedure suitably is carried out in about 15 seconds.

After purging of the cleaning chamber 1 is completed, the chamber is again pumped down to about 150 mtorr and the substrates are transferred through the loading port 3 to the deposition chamber 2. Due to the corrosive nature of hydrogen fluoride, it is necessary that all apparatus used in the cleaning procedure and, preferably, the transfer port 3 be lined with a suitable impervious material such as poly(tetrafluoroethylene). The deposition chamber 2 is evacuated to about $10^{-6}$ torr for metallization by vacuum evaporation. For the deposition of metallization by magnetron sputtering, the chamber is backfilled from the argon reservoir 8 to a pressure generally of about $10^{-2}$ to $10^{-3}$ torr. Although argon is preferred, other inert gases such as neon or xenon may be utilized.

The layer of metallization, e.g. aluminum or an alloy thereof, can be deposited on the substrate by conventional methods such as vacuum evaporation or magnetron sputtering, by a combination thereof, or by any other known comparable deposition. A preferred method of depositing the layer of metallization on the substrate is magnetron sputtering. By combination deposition is meant that the initial aluminum deposition is carried out by vacuum evaporation and the remainder by magnetron sputtering. This process prevents any impurities which might otherwise be trapped in the growing metallization film from adversely affecting the efficacy of the contact.

The substrates are thereafter removed from the deposition chamber 2, photolithographically patterned, and heated in a suitable apparatus, not shown, suitably at a temperature of from about 400° to 450° C. under a blanket of nitrogen or forming gas to sinter the coatings and alloy the metallization layer to the substrate.

The metallization process of this invention is advantageous in that, under a partial vacuum appropriate for vacuum deposition systems and a substrate temperature sufficiently higher than that of the cleaning vapor to prevent condensation thereof on the surface, a sufficient etch rate of undesirable oxide is generated so that the time required for substrate cleaning is approximately equal to conventional cassette-to-cassette metal deposition, even with the deposition of a barrier layer. It is thereby possible to produce an optimum metal-to-substrate contact by cleaning and metallizing the substrate sequentially within a closed system, thus avoiding any exposure to the atmosphere which would cause contamination of the contact. Because the cleaning and metallization steps of the subject process are of approximately equal duration, i.e. about one minute, the process is particularly suitable for large scale production.

The invention has been described with reference to preferred embodiments thereof. It will be appreciated by those skilled in the art that various modifications may be made from the specific details given without departing from the spirit and scope of the invention.

I claim:

1. A process of forming an ohmic contact between a layer of metallization and a substrate wherein the metallization contacts the substrate in contact openings in a layer of dielectric material covering the substrate comprising:

(a) heating the substrate under vacuum to at least about 30° C.;

(b) contacting the substrate with an etchant comprising hydrogen fluoride and water vapor, the temperature of the etchant being at least 5° C. below that of the substrate, thereby removing impurities etchable by hydrogen fluoride from the contact openings;

(c) sequentially in a closed system, depositing a layer of metallization onto the substrate to contact the substrate in the contact openings; and (d) heating the substrate to a temperature sufficient to sinter the coatings and alloy them to the substrate in the openings.

2. A process in accordance with claim 1, wherein the substrate is a silicon wafer, the dielectric material is silicon dioxide and the layer of metallization is aluminum or an alloy thereof.

3. A process in accordance with claim 2, wherein the alloys of aluminum are alloys with silicon, silicon and copper or silicon and titanium.

4. A process in accordance with claim 3, wherein the alloy is aluminum containing about one percent by weight of silicon.

5. A process in accordance with claim 1, wherein the etchant contains at least 25 percent by weight of hydrogen fluoride.

6. A process in accordance with claim 5, wherein the etchant contains about 49 percent by weight of hydrogen fluoride.

7. A process in accordance with claim 1, wherein the substrate temperature is about 35° C. and the etchant source vapor temperature is about 25° C.

8. A process in accordance with claim 1, wherein the layer of metallization is deposited by magnetron sputtering.

9. A process in accordance with claim 1, wherein the layer of metallization is deposited by vacuum evaporation.

10. A process in accordance with claim 2, wherein the substrate is heated to from about 400° to 450° C. to sinter the metallization to the substrate.

* * * * *